US008173521B2

(12) United States Patent
Kobayashi et al.

(10) Patent No.: US 8,173,521 B2
(45) Date of Patent: May 8, 2012

(54) METHOD FOR MANUFACTURING BONDED WAFER

(75) Inventors: Norihiro Kobayashi, Annaka (JP); Hiroji Aga, Annaka (JP); Yasuo Nagaoka, Annaka (JP); Nobuhiko Noto, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 232 days.

(21) Appl. No.: 12/452,085

(22) PCT Filed: Jul. 3, 2008

(86) PCT No.: PCT/JP2008/001754
§ 371 (c)(1),
(2), (4) Date: Dec. 15, 2009

(87) PCT Pub. No.: WO2009/016795
PCT Pub. Date: Feb. 5, 2009

(65) Prior Publication Data
US 2010/0120223 A1    May 13, 2010

(30) Foreign Application Priority Data

Jul. 27, 2007  (JP) ................................. 2007-196467

(51) Int. Cl.
*H01L 21/30* (2006.01)
(52) U.S. Cl. ................ 438/459; 257/E21.212; 438/455; 438/457
(58) Field of Classification Search ............ 438/455, 438/456, 457, 458, 459; 257/E21.212
See application file for complete search history.

(56) References Cited

U.S. PATENT DOCUMENTS

| | | | |
|---|---|---|---|
| 5,374,564 A | 12/1994 | Bruel | |
| 6,335,231 B1 | 1/2002 | Yamazaki et al. | |
| 6,372,609 B1 * | 4/2002 | Aga et al. ................... | 438/459 |

(Continued)

FOREIGN PATENT DOCUMENTS

EP    1 045 448 A1    10/2000

(Continued)

OTHER PUBLICATIONS

Extended European Search Report issued in European Application No. 08776766.1 on Sep. 22, 2010.

(Continued)

*Primary Examiner* — Fernando L Toledo
(74) *Attorney, Agent, or Firm* — Oliff & Berridge, PLC

(57) ABSTRACT

The present invention is a method for manufacturing a bonded wafer by an ion implantation delamination method including at least the steps of, bonding a bond wafer having a micro bubble layer formed by gas ion implantation with a base wafer to be a supporting substrate, delaminating the bond wafer along the micro bubble layer as a boundary to form a thin film on the base wafer, the method comprising, cleaning the bonded wafer after delaminating the bond wafer using ozone water; performing rapid thermal anneal process under a hydrogen containing atmosphere; forming a thermal oxide film on a surface layer of the bonded wafer by subjecting to heat treatment under an oxidizing gas atmosphere and removing the thermal oxide film; subjecting to heat treatment under a non-oxidizing gas atmosphere. As a result, the method for manufacturing a bonded wafer, which can remove the damage caused by the ion implantation and can suppress a occurrence of the concave defects without deterioration of surface roughness on the surface of the thin film of the bonded wafer after delamination is provided.

16 Claims, 2 Drawing Sheets

U.S. PATENT DOCUMENTS

| | | | |
|---|---|---|---|
| 7,029,993 | B1 | 4/2006 | Barge et al. |
| 7,442,623 | B2 * | 10/2008 | Endo et al. ............ 438/455 |
| 2005/0118789 | A1 | 6/2005 | Aga et al. |
| 2007/0117281 | A1 * | 5/2007 | Endo et al. ............ 438/149 |
| 2007/0190746 | A1 * | 8/2007 | Ito et al. ............ 438/455 |
| 2008/0072926 | A1 * | 3/2008 | Munakata ............ 134/2 |
| 2009/0117706 | A1 | 5/2009 | Soeta et al. |

FOREIGN PATENT DOCUMENTS

| | | |
|---|---|---|
| EP | 1 688 991 A2 | 8/2006 |
| EP | 1 868 230 A1 | 12/2007 |
| FR | 2 797 713 | 2/2001 |
| JP | A-5-211128 | 8/1993 |
| JP | A-2000-150905 | 5/2000 |
| JP | A-2000-294754 | 10/2000 |
| WO | WO 2006/070220 A1 | 7/2006 |
| WO | WO 2006/109614 A1 | 10/2006 |

OTHER PUBLICATIONS

Chinese Office Action issued in Chinese Patent Application No. 200880100644.0 on Jan. 30, 2011 (with partial translation).

International Search Report for International Application No. PCT/JP2008/001754, issued Oct. 7, 2008.

* cited by examiner

METHOD FOR MANUFACTURING BONDED WAFER

TECHNICAL FIELD

The present invention relates to a method for manufacturing a bonded wafer by using so-called an ion implantation delamination method in which the bonded wafer is manufactured by delaminating a wafer implanted ions after bonding and particularly to a method for manufacturing a bonded wafer in which a damaged layer remaining in a thin film on a surface of the bonded wafer after delaminating etc. can be removed.

BACKGROUND ART

Conventionally, a method for manufacturing a bonded wafer in which the bonded wafer is manufactured by delaminating a wafer implanted ions after bonding (so-called an ion implantation delamination method) has been known. For example, an SOI (silicon on insulator) wafer and the like are manufactured by using the method for manufacturing a bonded wafer.

The method is a technology of (See also Japanese Patent Application Laid-open (kokai) No. H5-211128), for example in the case of manufacturing a SOI wafer, forming an oxide film on at least one of two silicon wafers, implanting hydrogen ions or rare gas ions from a surface of the silicon wafer to form a micro bubble layer (an enclosed layer) in the wafer, then bringing the surface of the wafer that is implanted ions into close contact with the surface of the other silicon wafer via the oxide film, then performing heat treatment (delaminating heat treatment) to delaminate one of the wafers as a thin film so that the micro bubble layer is a cleavage plane and consequently providing an SOI wafer.

Damage caused by the ion implantation remains in the thin film SOI layer by the conventional ion implantation delamination method as described above. This remaining damage affects device characteristics etc. Thus, in order to remove the damage so as to improve the device characteristics, the SOI layer after delamination is subjected process. For example, the surface of the SOI layer after delamination is subjected to so-called sacrificial oxidation process to remove a damaged layer caused by the ion implantation.

However, the present inventors have examined the bonded wafer in which the thin film (SOI layer of SOI wafer etc.) on a surface of the bonded wafer after delaminating was subjected to conventional process, e.g. sacrificial oxidation process and measured the surface of the thin film by AFM (Atomic Force Microscope). As a result, the present inventors have discovered there were pits (hereinafter referred to as concave defect) having a diameter of 0.5 to 2 μm and a depth of 1 to 4 nm in the surface of the thin film. An existence of the concave defect as described above could affect the currently latest device characteristics.

DISCLOSURE OF INVENTION

In view of the above-explained problems, it is an object of the present invention to provide a method for manufacturing a bonded wafer by using an ion implantation delamination method, which can remove the damage caused by the ion implantation and can suppress an occurrence of the concave defects without deterioration of surface roughness on the thin film surface of the bonded wafer after delamination.

In order to accomplish the above object, the present invention provides a method for manufacturing a bonded wafer by an ion implantation delamination method including at least the steps of, bonding a bond wafer having a micro bubble layer formed by gas ion implantation with a base wafer to be a supporting substrate, delaminating the bond wafer along the micro bubble layer as a boundary to form a thin film on the base wafer, the method comprising, a first step of cleaning the bonded wafer after delaminating the bond wafer using ozone water; a second step of performing rapid thermal anneal process under a hydrogen containing atmosphere; a third step of forming a thermal oxide film on a surface layer of the bonded wafer by subjecting to heat treatment under an oxidizing gas atmosphere and removing the thermal oxide film; a fourth step of subjecting to heat treatment under a non-oxidizing gas atmosphere.

In this manner, when a surface of the bonded wafer after delaminating is cleaned using ozone water, an oxide film having a thickness of about 1 nm is formed on the surface of the thin film after delaminating. The oxide film is different from a thermal oxide film having a uniform film thickness and has a nonuniform film thickness distribution over the whole surface in a period of micron order.

When rapid thermal anneal process under a hydrogen containing atmosphere in the second step, a thin portion in the nonuniform film thickness distribution of the oxide film is etched early to form a pit where a silicon surface is exposed, and then etching of the silicon surface begins. Therefore, a particular crystal orientation disappears by an occurrence of random etching of the silicon surface and migration of silicon atoms sufficiently occur.

The rapid thermal anneal process and sacrificial oxidation process (process of subjecting to heat treatment under an oxidizing gas atmosphere to form a thermal oxide film on a surface of a bonded wafer and removing the thermal oxide film) sufficiently reduce the damage caused by the ion implantation in a delaminating plane. Therefore, an occurrence of local etching is suppressed in heat treatment under a non-oxidizing gas atmosphere thereafter. As a result, the concave defect, which is pit having a depth of nano-level, can be improved. Consequently, a bonded wafer having a flat surface in which the occurrence of the concave defects is reduced can be obtained.

Moreover, it is preferable that RTO process is performed after cleaning using ozone water so that an oxide film of 1 to 4 nm in thickness is formed on the surface of the thin film in the first step.

When the thickness of the oxide film formed in the first step is in the range as described above by RTO (Rapid Thermal Oxidation) process, the oxide film can be surely etched in the second step. Therefore, migration of silicon atoms can sufficiently occur.

Moreover, it is preferable that a temperature of the rapid thermal anneal is 1100° C. or more and 1250° C. or less in the rapid thermal anneal of the second step.

When the temperature of the rapid thermal anneal of the second step is 1100° C. or more, migration of silicon atoms can effectively occur. Further, when the temperature of the rapid thermal anneal of the second step is 1250° C. or less, an occurrence of slip dislocation in the SOI wafer can be suppressed and an occurrence of heavy metal contamination from a heat treatment furnace can be prevented.

Moreover, it is preferable that the non-oxidizing gas atmosphere is 100% argon atmosphere in the heat treatment of the fourth step.

In this manner, when the heat treatment of the fourth step under 100% argon atmosphere is conducted, the heat treatment atmosphere is surely prevented from becoming an oxidizing atmosphere, since oxygen is not contained. Therefore, the occurrence of the concave defects can be more effectively prevented.

Moreover, it is preferable that a fifth step of forming a thermal oxide film on the surface of the thin film by subjecting to heat treatment under an oxidizing gas atmosphere and removing the thermal oxide film is further performed after the fourth step.

In this manner, when the fifth step of forming the thermal oxide film on the surface of the thin film by subjecting to heat treatment under an oxidizing gas atmosphere and removing the thermal oxide film is further performed after the fourth step, a thickness of the thin film can be easily adjusted to a desired thickness.

The method for manufacturing a bonded wafer of the present invention as described above enables significantly reducing the occurrence of concave defects that occur on the surface of the thin film without deterioration of surface roughness of the surface of the thin film. Therefore, the method can respond to the currently latest device adequately, stabilize device characteristics and improve a yield.

BEST MODES FOR CARRYING OUT THE INVENTION

Hereinafter, the present invention will be explained more specifically.

As described above, the present inventors made investigation into the thin film of the bonded wafer (e.g. SOI layer of a bonded SOI wafer etc.) manufactured by using the conventional ion implantation delamination method. As a result, it was revealed that the concave defects occurred by AFM measurement of the surface of the thin film. The concave defects have a bad influence on device characteristics.

Thus, the present inventors investigated the concave defects in more detail. As a result, it is revealed that the concave defects exist in a density of about $1\times10^5/cm^2$ on the surface of the thin film. In the case that the concave defects exist in the density on the surface of the thin film, few concave defects are detected by measurement in 1 to 10 μm square as an AFM measurement area. However, the concave defects are frequently detected by measurement in relatively wide areas e.g. about 30 μm square.

Here, the present inventors thought that if an SOI wafer right after delamination is subjected to rapid thermal anneal process (rapid heating/rapid cooling process) under a hydrogen containing atmosphere, which has a high migration effect of silicon atoms, etching effect is suppressed since heat treatment time is short and consequently the concave defects can be reduced. So the present inventors have performed the following experiments and have made extensive studies.

As a result, the present inventors discovered that a surface state right after rapid thermal anneal process and a final concave defect density are affected by a process before rapid thermal anneal process under a hydrogen atmosphere, such as cleaning performed to the SOI wafer right after delamination (a pretreatment). In particular, the present inventors found out that when cleaning that forms a thin oxide film is performed as a pretreatment, that is, when the formed oxide film has a certain degree of nonuniform film thickness distribution rather than having a uniform film thickness distribution, the final concave defect density can be suppressed without deterioration of surface roughness right after rapid thermal anneal process, thereby bringing the present invention to completion.

Hereinafter, the result of the studies is shown in detail.

Experiments 1-7

The present inventors investigated the relationship between processes after delamination and the concave defects concerning a bonded wafer manufactured by using an ion implantation delamination method.

Here, the case of a bonded SOI wafer is described by way of example. First, a SOI wafer was manufactured by an ion implantation delamination method like a conventional method as described below. That is, the SOI wafer was manufactured by the process shown in FIG. 2.

Figure 2:
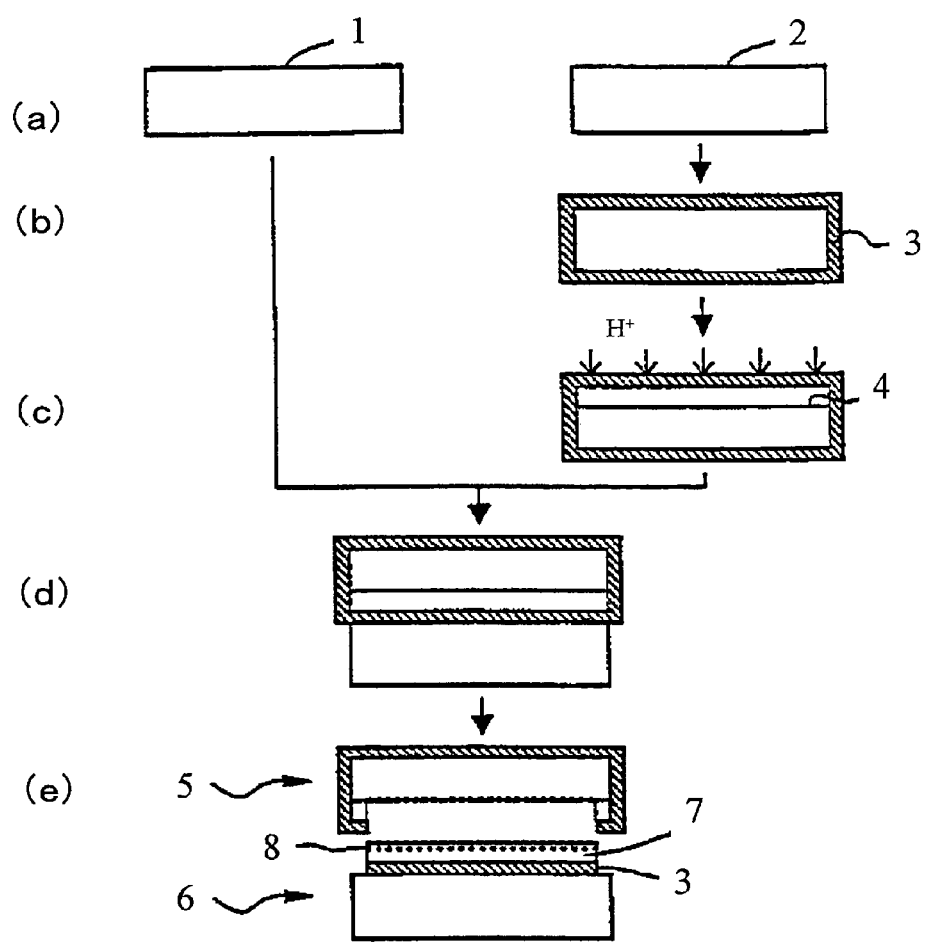
FIG. 2 is a flow chart showing an example of a process of manufacturing a bonded wafer by using an ion implantation delamination method.

In the ion implantation delamination method shown in FIG. 2, process (A) is to prepare two silicon mirror-surface wafers and more specifically, to prepare a base wafer 1 to be a supporting substrate and a bond wafer 2 to be an SOI layer that meet the specification of a device.

In this experiments, a silicon single crystal ingot produced by the Czochralski method and having a crystal orientation of <100>, conductivity type of p-type and a resistivity of 10 Ω·cm was sliced and processed to fabricate silicon mirror surface wafers having a diameter of 300 mm. These were divided into bond wafer and base wafer.

Next, in process (b), at least one of the wafers, the bond wafer 2 in this explanation, was subjected to thermal oxidation to form an oxide film 3 having a thickness of about 100 nm to 2000 nm on the wafer surface. Here, the oxide film having a thickness of 400 nm was formed.

In process (c), gas ions such as hydrogen ions or rare gas ions, hydrogen ions in this explanation, were implanted to one surface of the bond wafer 2 of which the oxide film 3 was formed on its surface to form a microbubble layer (an enclosed layer) 4 parallel to the surface at an average penetration depth of the ions.

Ion implanting conditions at this time were that the implanted ions were $H^+$ ions, implantation energy was 50 keV and dose amount was $5.0\times10^{16}/cm^2$.

In process (d), the hydrogen-ion-implanted surface of the bond wafer 2 to which hydrogen ions were implanted is superposed on the base wafer 1 through the oxide film 3 and brought into close contact with it. Usually, by bringing the surfaces of the two wafers into contact with each other at room temperature in a clean atmosphere, the wafers are boned together without using adhesives etc.

In the experiments, the wafers are boned together under room temperature in usual way.

Next, in process (e), the bond wafer was delaminated at the enclosed layer 4 as a boundary, thereby separating the bond wafer into a delaminated wafer 5 and an SOI wafer 6 (SOI layer 7+buried oxide film 3+base wafer 1). For example, heat treatment is conducted under an inert gas atmosphere at a temperature about 400° C. to 600° C., thereby permitting the separation into the delaminated wafer 5 and the SOI wafer 6 due to crystal rearrangement and agglomeration of bubbles in the enclosed layer. In addition, the damaged layer 8 remains in SOI layer 7 on the surface of the SOI wafer right after delamination.

It is to be noted that the delaminating heat treatment was performed at 500° C. for 2 hours under $N_2$ gas atmosphere.

Three cleaning conditions (experiment 1: cleaning for 3 minutes using HF solution of a concentration of 1.5%, experiment 2: cleaning for 3 minutes using $NH_4OH/H_2O_2/H_2O$ mixed solution of a temperature of 75° C., experiment 3: cleaning for 3 minutes using ozone water of a temperature of 25° C. (a concentration of $O_3$ was 16 ppm)) was set to thus obtained SOI wafer after delamination as a pretreatment before processes of the surface of the SOI layer (RTA process under a hydrogen containing atmosphere+sacrificial oxidation process+heat treatment under a non-oxidizing atmosphere) (experiments 1-3).

Next, each SOI wafer after cleaning was subjected to the processes of the surface of the SOI layer. And the final SOI surface after the processes was measured by AFM to obtain P-V value and concave defect density in 30 μm square.

Moreover, in order to compare thickness uniformity of the oxide film formed on the SOI layer surface with conditions of experiments 2 and 3, each SOI wafer after cleaning was separately prepared and after RTA process at 1050° C. for 5 seconds under 100% $H_2$, the oxide film surface in 2 μm square was measured by AFM to calculate pit density of the oxide film surface formed by etching effect during the RTA process.

As a result, in the case of experiment 1 in which an oxide film was not formed on the surface in cleaning of the pretreatment (HF process), although concave defects were sufficiently suppressed, the final P-V value was high since step depending on a crystal orientation of the SOI surface occurred by the RTA process under a hydrogen containing atmosphere right after the RTA process.

On the other hand, in experiment 2 and 3, the oxide film having a thickness approximately equal to each other was formed by cleaning of the pretreatment, but in experiment 2 in which the oxide film having a low pit density (that is, a high uniformity of the oxide film thickness) was formed, although the P-V value was an adequate value, the concave defect density was one digit higher than experiment 3 and the concave defects could not be sufficiently suppressed. In contrast to this, in experiment 3, a sufficient level of the P-V value and the concave defect density were obtained.

The detail of the phenomenon is not clear. However it is considered that because in RTA process under a hydrogen containing atmosphere, the oxide film having a nonuniform film thickness is etched early at the position (a random position in a plane) where the oxide film thickness is thin to occur etching of a silicon surface exposed then, consequently etching of the silicon surface proceeds at a random position in a plane, a particular crystal orientation disappears and migration of silicon atoms sufficiently occur. Therefore, it is considered that the P-V value is improved and the damage caused by the ion implantation in a delaminating plane can be reduced, then the occurrence of local etching can be suppressed in heat treatment under a non-oxidizing gas atmosphere and consequently, the concave defect, which is pit having a depth of nano-level, can be improved.

It is assumed that in the case of experiment 2 (cleaning using $NH_4OH/H_2O_2/H_2O$ mixed solution), since the thickness uniformity of the formed oxide film is high (the pit density is low) compared with the case of experiment 3 (cleaning using ozone water), there are a relatively few areas where the oxide film thickness is thin, etching of the oxide film is insufficient, portions where the oxide film removed imperfectly exist, the migration of silicon atoms does not sufficiently occur, and consequently, the P-V value and the concave defect density is not sufficiently improved.

Next, the same evaluation as experiments 1-3 was conducted using such SOI wafer that each thickness of the oxide films formed on the SOI surface was varied to be 3 nm and 4 nm by adding an oxidation process by RTO into each cleaning of two types (ozone water, $NH_4OH/H_2O_2/H_2O$ mixed solution).

In experiments 4 and 5 using ozone water as a cleaning liquid, when each oxide film thickness was 3 nm and 4 nm (pit density was $2.3 \times 10^8$ numbers/$cm^2$, $2.0 \times 10^8$ numbers/$cm^2$), the P-V value and the concave defect density were good.

On the other hand, in experiments 6 and 7 using $NH_4OH/H_2O_2/H_2O$ mixed solution as a cleaning liquid, when the oxide film thickness was 3 nm (pit density was $7.0 \times 10^6$ numbers/$cm^2$) in experiment 6, roughening of a surface occurred on a portion of the surface, the P-V value and the concave defect density measured even in a portion where roughening of a surface did not exist deteriorated. To make matters worse, any measurements were impossible in experiment 7. It is considered that this resulted from such reason that since the thickness uniformity of each oxide film in experiments 6 and 7 is relatively high (the pit density is low), there are a relatively few areas where the oxide film thickness is thin, etching of the oxide film is insufficient, portions where the oxide film removed imperfectly exist, the migration of silicon atoms do not sufficiently occur.

Hereinafter, a method for manufacturing a bonded wafer according to the present invention will be explained referring to FIG. 1. Here, the case of manufacturing a bonded SOI wafer is described by way of example. However, the present invention is not limited thereto. Whenever a bonded wafer is manufactured by an ion implantation delamination method, the present invention can be applied and can be obtained its effects.

Figure 1:
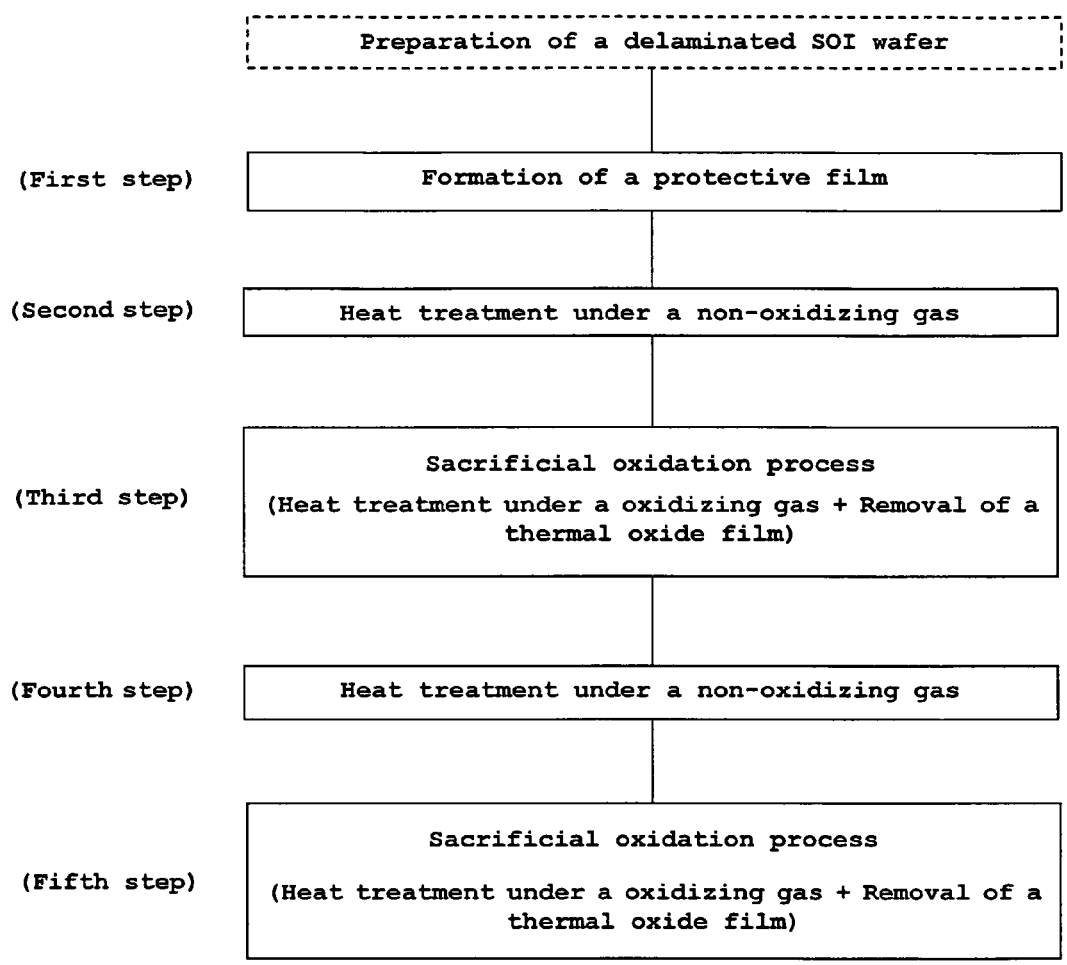
FIG. 1 is a flow chart showing an example of steps of a method for manufacturing a bonded wafer of the present invention.

FIG. 1 shows an example flow of steps of the method for manufacturing a bonded wafer of the present invention. It is to be noted that the SOI wafer after delamination manufactured by an ion implantation delamination method can be prepared by the same process as shown in experiments 1-7 and FIG. 2.

First Step

First, in the present invention, a SOI wafer having a thin film SOI layer on a surface is cleaned using ozone water to form a thin oxide film on the SOI layer surface. An ozone concentration of the ozone water is not restricted in particular, it can be 0.1 to 50 ppm for example. A temperature of ozone water is usually room temperature but it is not restricted thereto.

The oxide film having a thin thickness (e.g. about 1 nm) is formed on the SOI layer surface by cleaning using ozone water.

Here, as needed, RTO process is performed after cleaning using ozone water so that the oxide film of 1 to 4 nm in thickness can be formed in the first step. When the thickness of the oxide film is 4 nm or less, possibility of the occurrence of roughening of a surface by subsequent heat treatments can be eliminated.

Second Step

After forming the oxide film on the SOI layer surface as described above, rapid thermal anneal process under a hydrogen containing atmosphere is performed in a second step.

In this way, when RTA process under a hydrogen containing atmosphere is performed, the oxide film formed by cleaning using ozone water having a nonuniform film thickness is removed early at a position (a random position in a plane) where the oxide film thickness is thin to occur etching of a silicon surface exposed then, consequently etching of the silicon surface proceeds at a random position in a plane, a particular crystal orientation disappears and effect of migration of silicon atoms can be obtained sufficiently.

It is to be noted that a temperature of the heat treatment at this time is not restricted in particular, it is preferable that the temperature is 1100° C. or more to effectively generate the migration of silicon atoms. Moreover, when the temperature is 1250° C. or less, an occurrence of slip dislocation and heavy-metal contamination from a heat treatment furnace can be prevented.

Moreover, a hydrogen containing atmosphere is atmosphere containing $H_2$. It is preferable that the atmosphere is 100% $H_2$ to effectively generate the migration of silicon atoms, but the atmosphere may be a mixed gas atmosphere of $H_2$ and inert gas such as argon.

Third Step

Next, sacrificial oxidation process is performed. That is, first, heat treatment under an oxidizing gas atmosphere is performed to form a thermal oxide film on the surface of the SOI wafer and then the thermal oxide film is removed using HF aqueous solution and the like.

The remaining damaged area can be removed by the sacrificial oxidation process. In the first place, the heat treatment under an oxidizing gas atmosphere has effect of growing defects generated in the damaged portion by the ion implantation. Therefore, when heat treatment under a non-oxidizing gas atmosphere that is a fourth step is performed after the third step, the defect growing in the third step and the strain related to the defect are etched in fourth step and thereby the concave defects occur.

However, in the present invention, before the third step performing sacrificial oxidation process, the SOI wafer having a nonuniform film thickness is subjected to RTA process under a hydrogen containing atmosphere in the first step and the second step and thereby the surface is flattened and the damaged portion is subjected to recovering process using effect of migration of silicon atoms. Therefore, when the heat treatment under an oxidizing gas atmosphere is performed in the third step, the number of growing defects decreases since the number of damage decreases. Thus, an occurrence of the local etching resulted from the growing defects and the strain in the fourth step also decreases and consequently, the number of concave defects that occur by the etching effect can be significantly reduced.

Heat treatment conditions and a method for removing the formed thermal oxide film in the third step are not restricted in particular, these can be decided every time. The sacrificial oxidation process may be performed in the same manner as the conventional method.

Fourth Step

After the third step, heat treatment is performed under a non-oxidizing gas atmosphere.

As described above, until the third step, the number of defects that conventionally occur in the damaged portion and grow decreases extremely. Thus, since the number of growing defects and strain related to the defects naturally decreases, the number of occurrences of the local etching resulted from these is extremely suppressed.

It is to be noted that the heat treatment atmosphere in the fourth step may be a non-oxidizing gas and is not restricted in particular. However, if the atmosphere contains 1% oxygen, the atmosphere become an oxidizing atmosphere and effect of suppressing the occurrence of the concave defects is reduced. Thus, it is desirable that the atmosphere is, for example, 100% Ar.

Fifth Step

After performing the first step to the fourth step as described above, as needed, the thickness of the SOI layer can be adjusted to a desired thickness, for example, by further performing sacrificial oxidation process in the fifth step.

The sacrificial oxidation process itself may be performed in the same manner as the conventional method like the third step.

The method for manufacturing a bonded wafer of the present invention as described above enables removing the damage that remains in the thin film after delamination and that is caused by the ion implantation without deterioration of surface roughness and contamination of the thin film such as the SOI layer and the like, and significantly suppressing the occurrence of concave defects on the surface of the thin film, which frequently occur by conventional method. That is, a bonded wafer having a better device characteristics can be obtained.

Hereinafter, the present invention is explained in detail according to Examples and Comparative Examples. However, the present invention is not limited to these.

Example 1

An SOI wafer was fabricated by using the method for manufacturing a bonded wafer of the present invention.

A silicon single crystal ingot produced by the Czochralski method and having a crystal orientation of <100>, conductivity type of p-type and a resistivity of 10 Ω·cm was sliced and processed to fabricate silicon mirror surface wafers having a diameter of 300 mm. These were divided into bond wafer and base wafer, and a SOI wafer having a thin film SOI layer on a surface was obtained as a sample by the process shown in FIG. 2.

It is to be noted that a thickness of the SOI layer was 400 nm and a thickness of a buried oxide film was 150 nm. Ion implanting conditions were that implanted ions were $H^+$ ions, implantation energy was 50 keV and dose amount was $5.0 \times 10^{16}/cm^2$. Moreover, delaminating heat treatment was heat treatment at 500° C. for 2 hours under $N_2$ gas atmosphere.

The SOI wafer after delaminating obtained as describe above was cleaned for 3 minutes using ozone water of a temperature of 25° C. and an ozone concentration of 16 ppm to form an oxide film on a bonded wafer as the first step. A thickness of the oxide film was measured thereafter.

Then, RTA process was performed at 1150° C. for 30 seconds under 100% $H_2$ atmosphere as the second step.

Then, sacrificial oxidation process was performed as the third step. Specifically, after forming a thermal oxide film having a thickness of 150 nm by pyrogenic oxidation at 950° C. under a pyrogenic atmosphere, the thermal oxide film formed on the wafer surface was removed by 5% HF aqueous solution.

Next, heat treatment under a non-oxidizing gas atmosphere was performed again as the fourth step. Here, the heat treatment at 1200° C. for 1 hour under 100% argon atmosphere.

Furthermore, after pyrogenic oxidation at 950° C., the thermal oxide film formed on the surface of the wafer was removed by 5% HF aqueous solution to adjust a thickness of the SOI layer to a desired thickness as the fifth step.

Then, the surface of the SOI wafer was measured in 30 μm square by AFM to evaluate roughening of a surface of the SOI wafer surface and the P-V (Peak to Valley) value and the concave defect density was evaluated.

Comparative Example 1, 2

A SOI wafer was fabricated in the same conditions as Example 1 except that cleaning the surface of the SOI wafer in the first step of Example 1 was performed for 3 minutes using $NH_4OH/H_2O_2/H_2O$ mixed solution (blend ratio, 28 wt % $NH_4OH$:30 wt % $H_2O_2$:$H_2O$=1:1:20) at 75° C. (Comparative Example 1) and the same evaluation as Example 1 carried out.

Moreover, the SOI wafer was fabricated in the same conditions as Example 1 except that cleaning the surface of the SOI wafer in the first step of Example 1 was performed using HF solution of a concentration of 1.5% (Comparative Example 2) and the same evaluation as Example 1 carried out.

From results of the measurement of the oxide film thickness after the first step, a thickness of the oxide film formed on the wafer surface after the first step of Example 1 was 1 nm and a thickness of the oxide film formed on the surface of the wafer of Comparative Example 1 was 1.2 nm. The wafer of Comparative Example 2 did not have the oxide film since the oxide film on the surface was removed by the process of the first step.

Moreover, in order to determine pit density of the oxide film, a SOI wafer after the second step that was separately manufactured was subjected to RTA process at 1050° C. for 5 seconds under 100% $H_2$ atmosphere and the oxide film surface was measured in 2 μm square by AFM to calculate the pit density. As a result, the pit density of the wafer surface of Example 1 was $2.5 \times 10^8$ numbers/$cm^2$ and the pit density of the wafer surface of Comparative Example 1 was $1 \times 10^7$ numbers/$cm^2$. The pit density of the wafer of Comparative Example 2 could not be evaluated since the oxide film was not formed on the surface and was removed the oxide film by the process in the first step.

From results of the AFM measurement after the fifth step, the P-V value of the wafer surface of Example 1 was 2.5 nm, the P-V value of the wafer surface of Comparative Example 1 was 3.0 nm and the P-V value of the wafer surface of Comparative Example 2 was 4.5 nm. From the results, it was revealed that the surface of the wafers of Example 1 and Comparative Example 1 was relatively flat. On the other hand, step depending on plain orientation occurred on the surface of the SOI wafer manufactured in Comparative Example 2 after RTA process under a hydrogen containing atmosphere and therefore, it is considered that P-V value deteriorated and a flat surface could not be obtained.

In addition, results of the concave defect density were $2 \times 10^2$ numbers/$cm^2$ in the wafer surface of Example 1, $3 \times 10^3$ numbers/$cm^2$ in the wafer surface of Comparative Example 1 and $1 \times 10^2$ numbers/$cm^2$ in the wafer surface of Comparative Example 2. From the results, it is revealed that the occurrence of the concave defects was suppressed in the SOI wafer surface of Example 1 compared with the SOI wafer surface of Comparative Example 1.

As described results above, the bonded wafer having a flat surface and having few concave defects, which are pits having a depth of nano-level, can be fabricated by cleaning the thin film surface of the boned wafer using ozone water and performing RTA process under a hydrogen containing atmosphere.

Example 2, 3

A SOI wafer was manufactured in the same conditions as Example 1 except that RTO process for forming an oxide film having a thickness of 3 nm (Example 2) and 4 nm (Example 3) on a SOI layer surface was performed in between the first step and the second step and the same evaluation as Example 1 carried out.

As a result, it is revealed that a thickness of the oxide film formed after the first step of the SOI wafer of Example 2 was 3.0 nm, pit density of the oxide film surface after the second step was $3 \times 10^8$ numbers/$cm^2$, and the oxide film surface was nonuniform. Moreover, the P-V value of the wafer surface after the fifth step was 2.3 nm and the concave defect density was $3 \times 10^2$ numbers/$cm^2$. From the results, it was revealed that the SOI wafer surface of Example 2 was as flat as one of Example 1 and had few concave defects.

Moreover, it is revealed that a thickness of the oxide film formed after the first step of the SOI wafer of Example 3 was 4.0 nm, pit density of the oxide film surface after the second step was $2 \times 10^8$ numbers/$cm^2$, and the oxide film surface was nonuniform as well as Example 1 and 2. Moreover, the P-V value of the wafer surface after the fifth step was 2.1 nm and the concave defect density was $4 \times 10^2$ numbers/$cm^2$. Further, it was revealed that the SOI wafer surface of Example 3 was as flat as one of Example 1 and 2, and had few concave defects.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

For example, while the present invention was explained above by way of example of SOI wafer, the present invention is not limited to those, and it can also be applied to the case of a variety of bonded wafers.

The invention claimed is:

1. A method for manufacturing a bonded wafer by an ion implantation delamination method including at least the steps of, bonding a bond wafer having a micro bubble layer formed by gas ion implantation with a base wafer to be a supporting substrate, delaminating the bond wafer along the micro bubble layer as a boundary to form a thin film on the base wafer, the method comprising,
   a first step of cleaning the bonded wafer after delaminating the bond wafer using ozone water to form an oxide film on a surface of the bonded wafer;
   a second step of performing rapid thermal anneal process to the bonded wafer having the oxide film under a hydrogen containing atmosphere;
   a third step of forming a thermal oxide film on a surface layer of the bonded wafer by subjecting to heat treatment under an oxidizing gas atmosphere and removing the thermal oxide film;
   a fourth step of subjecting to heat treatment under a non-oxidizing gas atmosphere.

2. The method for manufacturing a bonded wafer according to claim 1, wherein RTO process is performed after cleaning using ozone water so that an oxide film of 1 to 4 nm in thickness is formed on a surface of the thin film in the first step.

3. The method for manufacturing a bonded wafer according to claim 1, wherein a temperature of the rapid thermal anneal is 1100° C. or more and 1250° C. or less in the rapid thermal anneal of the second step.

4. The method for manufacturing a bonded wafer according to claim 2, wherein a temperature of the rapid thermal anneal is 1100° C. or more and 1250° C. or less in the rapid thermal anneal of the second step.

5. The method for manufacturing a bonded wafer according to claim 1, wherein the non-oxidizing gas atmosphere is 100% argon atmosphere in the heat treatment of the fourth step.

6. The method for manufacturing a bonded wafer according to claim 2, wherein the non-oxidizing gas atmosphere is 100% argon atmosphere in the heat treatment of the fourth step.

7. The method for manufacturing a bonded wafer according to claim 3, wherein the non-oxidizing gas atmosphere is 100% argon atmosphere in the heat treatment of the fourth step.

8. The method for manufacturing a bonded wafer according to claim 4, wherein the non-oxidizing gas atmosphere is 100% argon atmosphere in the heat treatment of the fourth step.

9. The method for manufacturing a bonded wafer according to claim 1, wherein a fifth step of forming a thermal oxide film on the surface of the thin film by subjecting to heat treatment under an oxidizing gas atmosphere and removing the thermal oxide film is further performed after the fourth step.

10. The method for manufacturing a bonded wafer according to claim 2, wherein a fifth step of forming a thermal oxide film on the surface of the thin film by subjecting to heat treatment under an oxidizing gas atmosphere and removing the thermal oxide film is further performed after the fourth step.

11. The method for manufacturing a bonded wafer according to claim 3, wherein a fifth step of forming a thermal oxide film on the surface of the thin film by subjecting to heat treatment under an oxidizing gas atmosphere and removing the thermal oxide film is further performed after the fourth step.

12. The method for manufacturing a bonded wafer according to claim 4, wherein a fifth step of forming a thermal oxide film on the surface of the thin film by subjecting to heat treatment under an oxidizing gas atmosphere and removing the thermal oxide film is further performed after the fourth step.

13. The method for manufacturing a bonded wafer according to claim 5, wherein a fifth step of forming a thermal oxide film on the surface of the thin film by subjecting to heat treatment under an oxidizing gas atmosphere and removing the thermal oxide film is further performed after the fourth step.

14. The method for manufacturing a bonded wafer according to claim 6, wherein a fifth step of forming a thermal oxide film on the surface of the thin film by subjecting to heat treatment under an oxidizing gas atmosphere and removing the thermal oxide film is further performed after the fourth step.

15. The method for manufacturing a bonded wafer according to claim 7, wherein a fifth step of forming a thermal oxide film on the surface of the thin film by subjecting to heat treatment under an oxidizing gas atmosphere and removing the thermal oxide film is further performed after the fourth step.

16. The method for manufacturing a bonded wafer according to claim 8, wherein a fifth step of forming a thermal oxide film on the surface of the thin film by subjecting to heat treatment under an oxidizing gas atmosphere and removing the thermal oxide film is further performed after the fourth step.

* * * * *